United States Patent [19]

Mikami et al.

[11] Patent Number: 4,800,336

[45] Date of Patent: Jan. 24, 1989

[54] BATTERY LEVEL INDICATOR SUPPLYING DATA FROM A MEMORY TO A DISPLAY IN A POWER-OFF STATE

[75] Inventors: Tsutomu Mikami, Saitama; Masaaki Kojima, Kanagawa, both of Japan

[73] Assignee: Sony Corporation, Tokyo, Japan

[21] Appl. No.: 50,399

[22] Filed: May 18, 1987

[30] Foreign Application Priority Data

May 21, 1986 [JP] Japan ................................ 61-116819

[51] Int. Cl.[4] ........................................ G10N 27/02

[52] U.S. Cl. ........................................ 324/426; 320/48

[58] Field of Search ............... 324/426, 435, 433, 427; 340/636; 320/48

[56] References Cited

U.S. PATENT DOCUMENTS

| | | | |
|---|---|---|---|
| 4,234,840 | 11/1980 | Konrad et al. | 320/48 |
| 4,377,787 | 3/1983 | Kikuoka et al. | 324/426 |
| 4,380,726 | 4/1983 | Sado et al. | 320/48 |
| 4,520,353 | 5/1985 | McAuliffe | 340/636 |
| 4,536,757 | 8/1985 | Ijntema | 324/433 |
| 4,573,126 | 2/1986 | Lefebvre et al. . | |
| 4,575,680 | 3/1986 | Gold | 324/433 |

FOREIGN PATENT DOCUMENTS

| | | |
|---|---|---|
| 0003917 | 9/1979 | European Pat. Off. . |
| 83/00740 | 3/1983 | PCT Int'l Appl. . |
| 1544229 | 4/1979 | United Kingdom . |
| 2043272 | 10/1980 | United Kingdom . |

*Primary Examiner*—Reinhard J. Eisenzopf
*Assistant Examiner*—Maura K. Regan
*Attorney, Agent, or Firm*—Hill, Van Santen, Steadman & Simpson

[57] ABSTRACT

A battery level indicator for use with an electronic apparatus so arranged as to display, on an indicator, a real time voltage level detected by a voltage detector, when a battery is applying power to the electronic apparatus, and to display on the indicator the latest voltage read from a memory when the battery is not applying power to the electronic apparatus, whereby the indicator indicates how much power the battery will be able to supply to such electronic apparatus.

2 Claims, 3 Drawing Sheets

3
3a
ELECTRONIC APPARATUS MAIN BODY
1
2
13
VOLTAGE DET.
b
9
11
a
SAMPLING MEANS
MEMORY
c
12
7
10
PULSE GEN.
8

BATTERY LEVEL INDICATOR SUPPLYING DATA FROM A MEMORY TO A DISPLAY IN A POWER-OFF STATE

BACKGROUND OF THE INVENTION

1. Field of the Invention

The present invention relates to a battery level indicator for use with electronic apparatus, and more particularly, to a battery level indicator which can accurately indicate a how much power the battery will be able to supply to a connected electronic apparatus.

2. Description of the Prior Art

A known battery level indicator for use with electronic apparatus is arranged to indicate the voltage level of a battery as it is, without taking into account the effect thereon of its relationship with the electronic apparatus.

When power is being supplied from the battery to the electronic apparatus, the battery level or voltage is decreased, as compared with the open-circuit voltage, due to the voltage drop across its internal resistance. This difference between the battery level and the open-circuit voltage may be large, especially in the case of an alkaline battery. Accordingly, although the user may judge that the battery is still able to supply enough power on the basis of the indicated battery level, when the power is not being supplied from the battery to the electronic appartus, it is often seen that the remaining power of the battery will not be as adequate as is indicated.

OBJECTS AND SUMMARY OF THE INVENTION

Accordingly, it is an object of this invention to provide an improved battery level indicator for use with an electronic apparatus.

It is another object of this invention to provide a battery level indicator which can indicate how much power a battery will be able to supply to a connected electronic apparatus.

According to one aspect of the present invention, there is provided a battery level indicator for use with an electronic apparatus comprising:

(a) voltage detecting means for detecting a voltage of a battery which is applying power to said electronic apparatus;

(b) memory means for storing data representative of the current or latest voltage detected by said voltage detecting means;

(c) switching means for selecting the voltage detected by said voltage detecting means or the voltage previously read out from said memory means;

(d) an indicator connected to receive a voltage from said switching means; and (e) data supplying means for supplying voltage data from said memory means through said switching means to said indicator.

These and other objects, features and advantages of the present invention will become apparent from the following detailed description of the preferred embodiments taken in conjunction with the accompanying drawings, in which like reference numerals identify like elements and parts.

DESCRIPTION OF THE PREFERRED EMBODIMENTS

Figure 1:
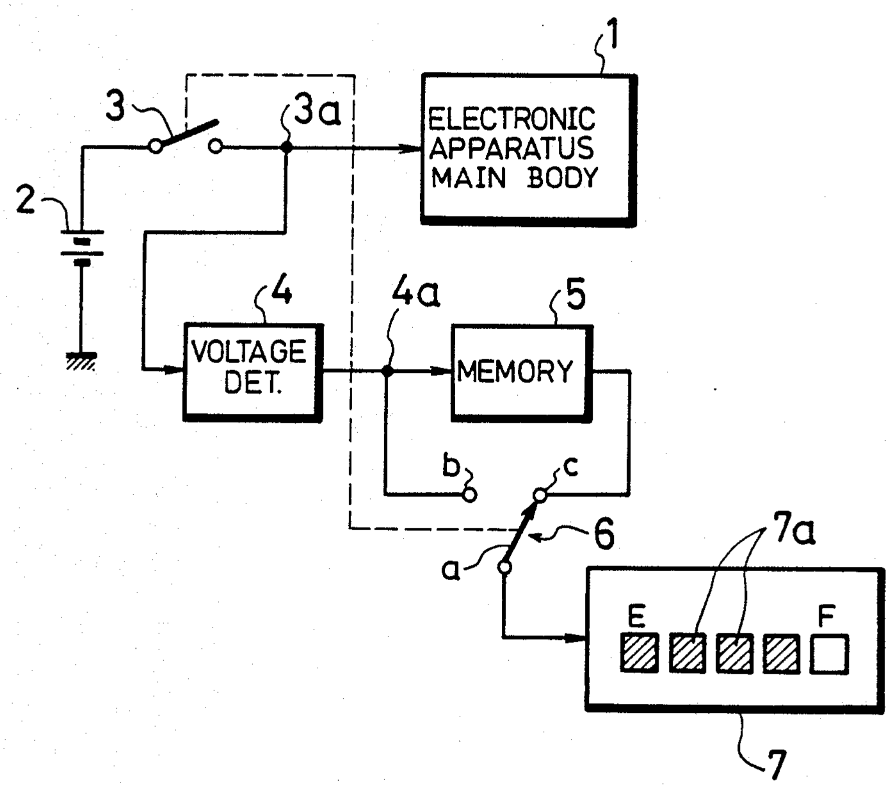
FIG. 1 is a block diagram showing an illustrative embodiment of a battery level indicator according to the present invention.

Referring to FIG. 1, there is shown an electronic apparatus main body such as the main body of a video tape recorder (VTR), a radio receiver, a television receiver and so on. A battery 2 is accommodated in the electronic main body 1, which may be of a dry cell battery type, a rechargeable storage battery or the like. The voltage of the battery 2 is applied through a power supply switch 3 to the electronic apparatus main body 1.

A voltage detecting circuit 4 is adapted to detect a voltage at a junction 3*a* between the power supply switch 3 and the electronic apparatus main body 1. The voltage detecting circuit 4 is formed of, for example, a high resistance resistor which is connected between the junction 3*a* and ground. An output terminal 4*a* is connected to the voltage detector resistor either at the connection 3*a* or to a middle point of the resistor. The voltage detecting circuit may thus function as a voltage divider, whereby the voltage supplied to the output terminal 4*a* has its level adjusted as desired, while remaining proportional to the voltage at the junction 3*a*.

A memory 5 (for example, a condenser memory) is connected to the voltage detecting circuit 4 at its output terminal 4*a*, and stores data which represents the latest voltage of the battery 2 as detected by the voltage detecting circuit 4. The operation of last condition memory is well known in the prior art such as, for example a last channel memory of a television receiver, so it need not be described in detail. A memory unit capable of long-term date storage may be used.

A change-over switch 6 has a one movable contact a and two fixed terminals b and c. The fixed terminal b of this change-over switch 6 is connected to the output terminal 4*a* of the voltage detecting circuit 4 and the other fixed terminal c thereof is connected to the output terminal of the memory 5. The movable contact a of this switch 6 is connected to an indicator or display unit 7. This indicator 7 may any be of various types of voltage indicators, and as shown in this embodiment, it is a liquid crystal type. This indicator 7 is provided with a plurality of rectangular-shaped indicating elements 7*a* aligned in a straight line, which can indicate the voltage level of the battery 2 in correspondence with the number of indicating elements 7*a* which are activated. In this case, when only the indicating element 7*a* located at the left-hand end is in the indicating state the battery 2 is exhausted and will not be able to supply power any more. On the other hand, when the indicating elements 7*a* located through the left-hand end to right-hand end are in the indicating state, the battery 2 has sufficient residual power to power the electronic apparatus for our extended period.

The change-over switch 6 is operated in ganged relation with the power supply switch 3 (as shown by a broken line) so that when the power supply switch 3 is turned on, or closed, the change-over switch 6 connects its movable contact a to the fixed terminal b, and when the power supply switch 3 is turned off, the change-over switch 6 connects its movable contact a to the fixed terminal c, as shown in FIG. 1.

The operation of the embodiment of the battery level indicator according to the present invention will now be described. When the power supply switch 3 is turned on, the movable contact a of the change-over switch 6 is switched to be connected to the fixed terminal b to allow the voltage detecting circuit 4 to directly detect the voltage of the battery 2, which is now applying a power to the electronic apparatus main body 1, with the detected present or real time voltage being supplied to the indicator 7, on which it is indicated.

When the power supply switch 3 is turned off, the movable contact a of the change-over switch 6 is switched to be connected to the fixed terminal c. At that time, the voltage read out of the memory 5 (the latest voltage supplied from the battery 2 to the electronic apparatus main body 1 just before the turning-off of the switch 3), is applied to the indicator 7, on which it is indicated or displayed.

Another embodiment according to this invention will be described with reference to FIG. 2.

Figure 2:
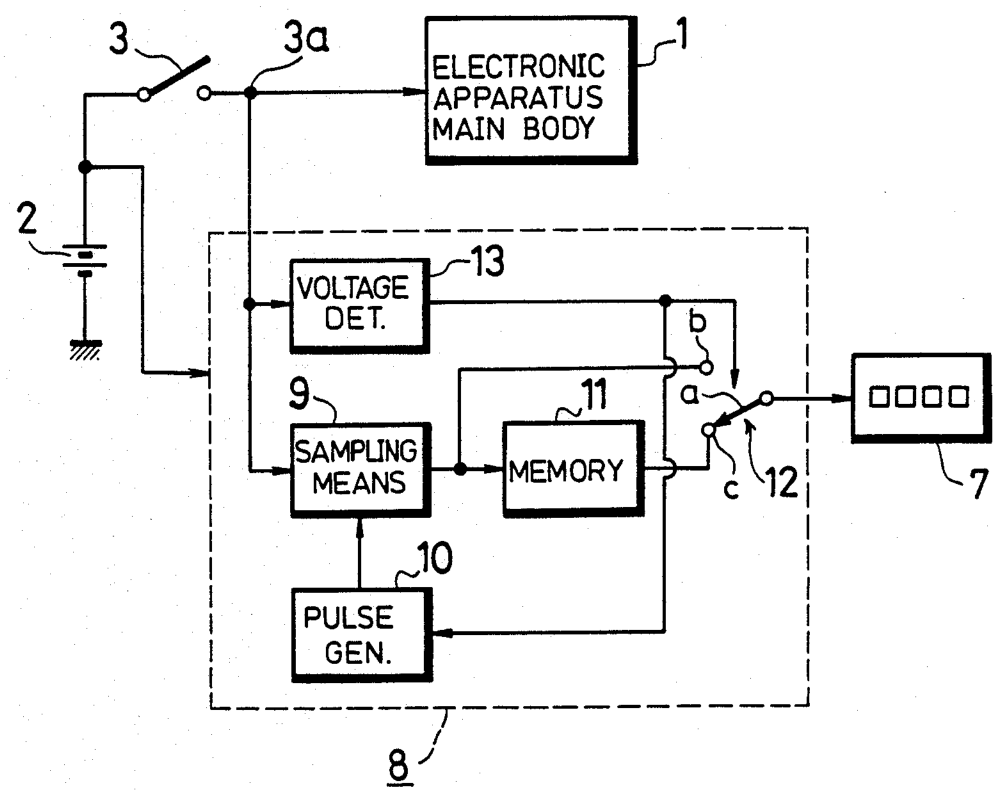
FIG. 2 is a block diagram showing another embodiment of the battery level indicator according to the present invention.

Referring to FIG. 2, there is shown the electronic apparatus main body 1 such as a video tape recorder (VTR), a radio receiver, a television receiver and so on. The battery 2 is accommodated in the electronic apparatus main body 1, which may be of a dry cell battery type, a rechargeable storage type or the like. The voltage from the battery 2 is applied through the power supply switch 3 to the electronic apparatus main body 1 similar to the embodiment shown in FIG. 1.

A microcomputer 8 is shown (by a broken line block) which computer incorporates various function units such as a voltage sampling means 9, a pulse generating means 10, a memory means 11, a switching means 12 and a voltage detector 13 for detecting the presence or absence of a voltage. The microcomputer 8 may be directly supplied with the operating voltage from the battery 2 or with other voltage from a power supply (not shown) that may convert the voltage of the battery 2 to another voltage value, if necessary. The sampling means 9 is adapted to sample a voltage developed at the junction 3*a* between the power supply switch 3 and the electronic apparatus main body 1 in response to a sampling pulse supplied thereto from the sampling pulse generating means 10. The sampling pulse generating means 10 generates the sampling pulse on the basis of the detected output from the voltage detector 13 in response to the presence or absence of a voltage at the junction 3*a*. Only when the voltage detection 13 is supplied with the voltage developed at the junction 3*a* is the pulse generator 10 enabled, i.e. only when the switch 3 is closed.

The output voltage from the sampling means 9 is supplied to the memory 11 so that data stored in the memory 11 corresponds to the latest sample voltage from the sampling means 9. The switching means 12 is provided with one movable contact a and two fixed terminals b and c. The sampled voltage from the sampling means 9 is supplied to one fixed terminal b of the switching means 12 and the latest sampled voltage read out from the memory 11 is supplied to the other fixed terminal b of the switching means 12. The movable contact a of the switching means 12 is connected to the indicator 7, which is constructed in the same way as described in connection with FIG. 1.

The switching means 12 is switchably controlled by the detected output from the voltage detector 13. That is, when the voltage is applied to the junction 3*a* between the power supply switch 3 and the electronic apparatus main body 1, the switching means 12 connects its movable contact a to the fixed terminal b, while when no voltage is supplied thereto, its movable contact a is connected to the other fixed terminal c.

The operation of the embodiment of the battery level indicator shown in FIG. 2 will be described with reference to the flow chart of FIG. 3.

Figure 3:
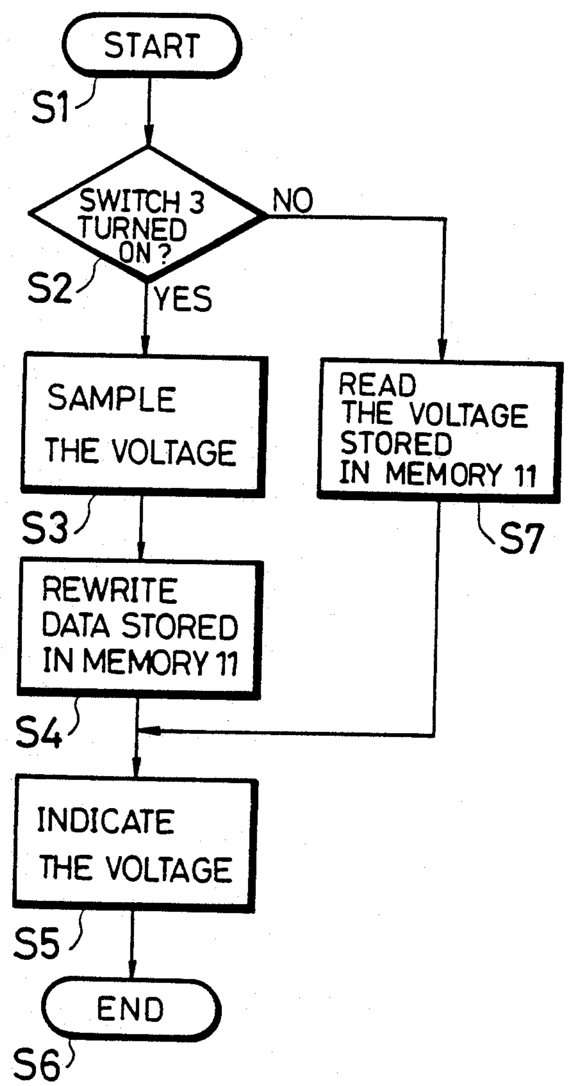
FIG. 3 is a flow chart to which references will be made in explaining the operation of the battery level indicator shown in FIG. 2

Referring to FIG. 3, the microcomputer 8 begins executing the processing at step S1. At the next step S2, it is detected whether the power supply switch 3 is turned on (closed) or not. When it is turned on, the switching means 12 connects its movable contact a to the fixed terminal b by the detected output from the voltage detector 13 and at the same time, the sampling means 9 samples the voltage developed at the junction 3*a* between the power supply switch 3 and the electronic apparatus main body 1 (at step S3). That is, the sampling means 9 samples the real time voltage supplied from the battery 2 to the electronic apparatus main body 1. The sampled voltage from the sampling means 9 is supplied to the memory 11, in which the data stored in the memory 11 is rewritten or altered to represent or correspond to the latest sampled voltage (at step S4). At the same time, the sampled voltage is directly supplied to the indicator 7, on which it is indicated (at step S5). Then, the processing ends with step S6.

When the power supply switch 3 is, on the other hand, in the open or off condition at step S2, the switching means 12 is switched by the detected output from the voltage detector 13, such that its movable contact a is connected to its fixed terminal c. Also, the sampling means 9 is inhibited from sampling the voltage developed at the junction 3*a* by the output from the detecting means 13 Then, the latest sampled voltage read out of the memory 11 (at step S7) which is the voltage supplied to the electronic apparatus main body 1 just before the power switch 3 is turned off, is supplied to the indicator 7 and the voltage is indicated thereon at step S5.

According to the present invention as set forth above, the battery level indicator for use with an electronic apparatus can indicate substantially how much power the battery will be able to supply to a specific connected electronic apparatus.

It will be apparent that many modifications and variations could be effected in the apparatus of the invention by one skilled in the art, without departing from the spirit or scope of the novel concepts of the invention so that the scope of the invention should be determined by the appended claims only. For example, the voltage detector 13 and the switch 12 of FIG. 2 can be eliminated, so that the output of the memory 11 is always supplied to the indicator 7. Then the indicator 7 displays the present or real time voltage when the switch 3 is in its closed or on condition, and at other times the sampling means 9 is not operative to change the data stored in the memory 11, so that the indicator displays th last voltage when the switch 3 is open.

We claims as our invention:

1. A battery level indicator for use with an electronic apparatus comprising:

(a) voltage detection means for detecting the application of power to said electronic apparatus from a battery, for producing an output signal in response to such application of power.

(b) sampling means connected to said electronic apparatus for sampling the value of voltage applied thereto from said battery.

(c) memory means connected to said sampling means for storing data corresponding to the voltage level applied to said electronic apparatus, (d) an indicator for displaying data, and (e) data supplying means connected to and responsive to said voltage detecting means for supplying real time voltage data from said sampling means to said indicator while said battery is applying power to said electronic apparatus, and for supplying voltage data from said memory means to said indicator when said battery is not applying power to said electronic apparatus.

2. A battery level indicator according to claim 1, incorporating a microcomputer, said microcomputer including said voltage detector, said sampling means, said memory means, and said data supply means, said microcomputer having stored program means for controlling said sampling means and said memory means whereby new voltage data is continuously written into said memory means while said electronic apparatus is receiving power from said battery, said memory means retaining stored data when said electronic apparatus is in its power-off state, whereby said indicator displays the real time voltage applied by said battery to said electronic apparatus when said electronic apparatus is in its power-on state, and said indicator displays the data from said memory means when said battery is not supplying power to said electronic apparatus.

* * * * *